(12) United States Patent
Fukase

(10) Patent No.: US 7,492,337 B2
(45) Date of Patent: Feb. 17, 2009

(54) ELECTRO-OPTICAL DEVICE

(75) Inventor: Akio Fukase, Chino (JP)

(73) Assignee: Seiko Epson Corporation, Tokyo (JP)

( * ) Notice: Subject to any disclaimer, the term of this patent is extended or adjusted under 35 U.S.C. 154(b) by 667 days.

(21) Appl. No.: 11/023,352

(22) Filed: Dec. 29, 2004

(65) Prior Publication Data

US 2005/0156515 A1    Jul. 21, 2005

(30) Foreign Application Priority Data

Jan. 7, 2004 (JP) ............................. 2004-002286
Nov. 15, 2004 (JP) ............................. 2004-330055

(51) Int. Cl.
*G09G 3/30* (2006.01)
*G09G 3/32* (2006.01)

(52) U.S. Cl. .......................................... 345/76; 345/82

(58) Field of Classification Search .................. 345/76, 345/77, 82, 83; 315/169.1, 169.3; 313/504, 313/506

See application file for complete search history.

(56) References Cited

U.S. PATENT DOCUMENTS

| | | | |
|---|---|---|---|
| 6,366,025 B1 | 4/2002 | Yamada | |
| 6,768,482 B2 | 7/2004 | Asano et al. | |
| 6,825,820 B2 * | 11/2004 | Yamazaki et al. | ............. 345/76 |
| 7,279,834 B2 * | 10/2007 | Kanno et al. | ................. 313/504 |
| 2003/0052597 A1 | 3/2003 | Sakurai | |
| 2005/0087740 A1 | 4/2005 | Matsumoto et al. | |

FOREIGN PATENT DOCUMENTS

| | | |
|---|---|---|
| JP | A 2000-235891 | 8/2000 |
| JP | A 2001-290441 | 10/2001 |
| JP | A 2002-221917 | 8/2002 |
| JP | A 2003-168561 | 6/2003 |
| JP | A 2005-100724 | 4/2005 |

* cited by examiner

*Primary Examiner*—Kevin M Nguyen
(74) *Attorney, Agent, or Firm*—Oliff & Berridge, PLC

(57) ABSTRACT

To provide an electro-optical device which has the high degree of freedom with regard to changes in the area of a pixel region, and which can adjust brightness or a life span between light-emitting elements, easily control the white balance, and lengthen the life span of the overall display device. A top emission type of electro-optical device comprises first wiring lines, second wiring lines substantially orthogonal to the first wiring lines, and pixel regions selected by the first and second wiring lines. The electro-optical device has a plurality of pixel regions, and at least one of the pixel regions is provided so as to exceed a unit region surrounded by one of the first wiring lines and one of the second wiring lines, which select the at least one pixel region, and another of the first wiring lines and another of the second wiring lines respectively adjacent to one of the first wiring lines and one of the second wiring lines.

9 Claims, 7 Drawing Sheets

ELECTRO-OPTICAL DEVICE

BACKGROUND

The present invention relates to an electro-optical device for emitting light from a self-emitting element by using a pixel driving circuit.

In an electro-optical device such as an organic electroluminescence (hereinafter, referred to as 'EL'), it has been widely used a method that pixel regions emitting different color light components from each other are arranged in a matrix and light components emitted from the respective pixel regions are synthesized, such that the full color display is realized. As an example, there is a RGB method in which the pixel regions for red (R), green (G), and blue (B) are arranged side by side. The color light components emitted from the respective pixel regions depend on a light-emitting material included in a light-emitting element of each pixel region.

However, since light-emitting efficiency is different according to the type of the light emitting material used, if each pixel region emits light under the same condition, the quantity of light of a specific color is generally reduced. Thus, when light components emitted from the pixel regions are synthesized, a desired color cannot be displayed with high definition. In particular, in the case of the RGB method, three color light components are synthesized to display white light. However, when the brightness balance (that is, white balance) for displaying white is poor, the overall quality of the display device is degraded.

In this case, the light-emitting element such as the organic EL element is known to have a feature that the quantity of light is proportional to current value, and thus large current preferably needs to be supplied to the light-emitting element for emitting a large quantity of light.

However, in the organic EL element, when a large current per a unit area is needed, the light emitting material deteriorates exponentially. Accordingly, when a large current flows into a specific light-emitting element, the life span of the light-emitting element becomes short as compared to other light-emitting elements. As a result, the color irregularity is caused and the overall display device deteriorates rapidly.

As a countermeasure against these problems, a method in which the light emitting area of the light emitting region emitting the color light component having the highest light-emitting efficiency decreases as compared to the light emitting areas of the light emitting regions emitting other color light components, thereby lengthening the life span and controlling the white balance is disclosed (Patent Document 1). According to Patent Document 1, a display pixel is formed on a region surrounded by a gate signal line 51 and a drain signal line 52.

On the other hand, it has been also known that the life span of the light-emitting element (the time that brightness deteriorates) is different according to the type of the light-emitting material used. Therefore, even though the same amount of current is supplied to the respective light-emitting elements, the difference in brightness between the respective color light components occurs as the time passes, and thus the white balance is collapsed and the color irregularity is caused.

As another countermeasure against these problems, a method in which the light emitting area of the self-emitting device that represents the shortest half brightness time is made to be larger than that of the self-emitting device that represents the longest half brightness time is disclosed (Patent Document 2). According to Patent Document 2, by changing the interval of the signal lines, the area of the pixel region is changed.

[Patent Document 1] Japanese Unexamined Patent Application Publication No. 2001-290441.

[Patent Document 2] Japanese Unexamined Patent Application Publication No. 2003-168561.

SUMMARY

However, when the display pixel is formed on the region surrounded by the gate signal line and the drain signal line, the light emitting region has only the area of the region surrounded by the drain signal line and the gate signal line at the most. As a result, the light emitting region can not have a sufficient area. In contrast, when the light emitting area of the light-emitting element having the higher light-emitting efficiency is small, the non-emitting area increases large in the area surrounded by the drain signal line and the gate signal line. As a result, brightness of the overall panel is decreased.

On the other hand, in the display device in which the area of the pixel region is changed by changing the interval of the signal lines, whenever the area of each pixel region is changed, it is needed to modify the design according to the arrangement of the thin film transistors, or the wiring lines of the gate signal lines or the drain signal lines.

Accordingly, it is an object of the present invention to provide an electro-optical device which has a high degree of freedom for changes in the area of a pixel region, and thus which can adjust brightness or a life span of light-emitting elements, easily control the white balance, and lengthen the life span of the overall display device.

In order to solve the above-mentioned problems, according to the present invention, there is provided an electro-optical device comprising first wiring lines, second wiring lines substantially orthogonal to the first wiring lines, a plurality of pixel regions selected by the first and second wiring lines, light-emitting elements included in the pixel regions provided on a substrate, first electrodes, second electrodes made of a transparent material, and light-emitting layers interposed between the first and second electrodes. Light emitted from the light-emitting layer is radiated in a direction opposite to the substrate via the second electrode. The electro-optical device comprises the plurality of pixel regions, at least one of the plurality of pixel regions is provided to exceed a unit region surrounded by one of the first wiring lines and one of the second wiring lines, which select the pixel region, and another of the first wiring lines and another of the second wiring lines respectively adjacent to one of the first wiring lines and one of the second wiring lines.

According to the above-mentioned structure, since the area of the pixel region can extend to the adjacent unit region without remaining in the unit region, the degree of freedom with regard to the area is high. In addition, even though the area of any pixel region is smaller than the unit area, if the adjacent pixel region is formed such that the adjacent pixel regions exceeds the wiring lines to bury the corresponding pixel region, the non-emitting region can not occur.

In addition, the electro-optical device has the top emission type device configuration. Thus, even when the adjacent pixel region exceeds the wiring lines, there is no case in which the light emission is blocked due to the wiring lines or thin film transistors provided on the substrate, like the bottom emission type of device structure. Therefore, the area of each pixel region can be freely determined and the quantity of light of the overall display device can increase.

Further, since the wiring lines can be arranged at an equal interval irrespective of the area of the pixel region, when the area of the pixel region is changed, it has advantage that the design of the wiring lines is not needed to be changed.

In this manner, when the large current is supplied to a specific pixel region to improve the quantity of light of the specific pixel region or when the pixel region which fast deteriorates exists, the current amount per the unit area can be adjusted. As a result, the life span of the overall electro-optical device can be lengthened without lowering the brightness balance.

In the present specification, the first wiring line represents any one of a data line or a scanning line. In addition, when the first wiring line represents the data line, the second wiring line represents the scanning line. To the contrary, when the first wiring line represents the scanning line, the second wiring line represents the data line.

Further, according to the present invention, there is provided an electro-optical device comprising first wiring lines, second wiring lines substantially orthogonal to the first wiring lines, a plurality of pixel regions selected by the first and second wiring lines, light-emitting elements included in the pixel regions provided on a substrate, first electrodes, second electrodes made of a transparent material, and light-emitting layers interposed between the first and second electrodes. Light emitted from the light-emitting layer is radiated in a direction opposite to the substrate via the second electrode. The electro-optical device comprises basic pixels, each basic pixel being constructed by a plurality of pixel regions and at least one of the pixel regions of each basic pixel being provided to exceed a unit region surrounded by one of the first wiring lines and one of the second wiring lines, which select the pixel region, and another of the first wiring lines and another of the second wiring lines respectively adjacent to one of the first wiring lines and one of the second wiring lines.

According to the above-mentioned structure, the area of each pixel region is adjusted according to the difference in light-emitting efficiency or the life span of the light-emitting elements of the pixel regions constituting each basic pixel. At this time, even though the adjacent pixel region exceeds the wiring lines, in the top emission type device configuration, there is no case in which the light emission is blocked due to the wiring lines or thin film transistors provided on the substrate like the bottom emission type device configuration. That is, in the top emission type device configuration, the area of each pixel region can be freely adjusted. Therefore, since the brightness balance between the pixel regions included in each basic pixel is excellent, if the light components emitted from the pixel regions are synthesized, the basic pixel can display desired color with high definition. In addition, the non-emitting region can be prevented from occurring and the quantity of light of the overall display device can increase. In addition, the specific pixel region can be prevented from fast deteriorating, and thus the color irregularity can be prevented from occurring. As a result, the life span of the overall electro-optical device can be lengthened.

In the electro-optical device according to the present invention, preferably, the total area of the basic pixel does not exceed the total area of the unit regions which have the same total number of pixel regions as that of the basic pixel. According to this configuration, for example, when the basic pixel is composed of three pixel regions, the total area of the basic pixel is provided not to exceed the total area of the three unit regions. The area of each of the three pixel areas is determined according to light-emitting efficiency or the life span of the light-emitting element included in each pixel region and is not restricted by the arrangement of the wiring lines which partition the three unit regions. Therefore, the area of each pixel region can be relatively freely adjusted and the basic pixels can be easily arranged in a matrix.

In the electro-optical device according to the present invention, in the basic pixel, the area of the pixel region increases when the pixel region includes a light-emitting element having low light-emitting efficiency. According to this configuration, in the case in which light-emitting efficiency of the light-emitting element emitting the specific color light component is bad, the current value for the unit area can be suppressed to the current value substantially equal to those of other pixel regions, even though current larger than that in the other pixel regions flows into the corresponding light-emitting element. Therefore, only the corresponding light-emitting element can be prevented from fast deteriorating.

In the electro-optical device according to the present invention, the first and/or second wiring lines are preferably arranged at substantially equal intervals, and in each basic pixel, the area of each pixel region is preferably set according to the characteristics of the light-emitting element. For example, when the light-emitting element which can reduce the area of the pixel region as compared to other pixel regions exists so as to relatively improve light-emitting efficiency, by reducing the area of the pixel region having the light-emitting element as compared to other pixel regions, the long life span and the easy control of the white balance can be realized. However, in the configuration in which the first and second wiring lines are arranged at the equal interval and the pixel region does not exceed the unit region, when the area of the specific pixel region decreases as compared to those of other pixel regions, the non-emitting portion increases and brightness of the panel deteriorates. To the contrary, according the present invention, even when the area of the pixel region having the specific light-emitting element decreases as compared to those of other pixel regions, by expanding the area of the adjacent pixel region having the light-emitting element with relatively low light-emitting efficiency to exceed the unit region, the increase of the non-emitting portion is suppressed, so that brightness of the panel can be efficiently prevented from deteriorating.

In the electro-optical device according to the present invention, in each basic pixel, the area of the pixel region increases when the pixel region includes a light-emitting element having a short life span. According to this configuration, when the light-emitting element emitting the specific color light component fast deteriorates, the current value per the unit area of the light-emitting element can be reduced, and thus the life span of the corresponding pixel region can be lengthened.

In the electro-optical device according to the present invention, when light components emitted from the pixel regions constituting the basic pixel are synthesized to display white light, the area of the pixel region increases when the pixel region includes a light-emitting element emitting a color light component which needs a large quantity of light. According to this configuration, even though the current larger than that in other pixel regions flows into the light-emitting element emitting a color light component which needs the larger quantity of light, the current value for the unit area can be suppressed to the current value substantially equal to that in other pixel regions. Therefore, only the corresponding light-emitting element can be prevented from fast deteriorating and excellent white balance can be obtained. As a result, the life span of the overall display device can be lengthened.

Furthermore, in the electro-optical device according to the present invention, when light components emitted from the pixel regions constituting the basic pixel are synthesized to display white light, the area of the pixel region increases when the pixel region includes a light-emitting element emitting the color light component which has a high ratio of necessary quantity of light to light-emitting efficiency. According to this configuration, the quantity of light that is needed to obtain the excellent white valance is set to be large and the area of the light-emitting element having the lowest light-emitting efficiency is set to have the largest area. Therefore, even when large current flows into the light-emitting element, the balance in the life span and brightness between the pixel regions can be achieved without increasing the current amount for the unit area as compared to other pixel regions.

According to the present invention, there is provided an electronic apparatus comprising the electro-optical device according to the present invention. Here, 'the electronic apparatus' means general apparatuses that exhibit a constant function and the configuration of the electronic apparatus is not particularly limited. The electronic apparatus may be, for example, an IC card, a cellular phone, a video camera, a personal computer, a head-mounted display, a rear or front type projector, a television (TV), a roll-up type TV, a facsimile device having a display function, a finder of a digital camera, a portable TV, a DSP (digital signal processing) device, a PDA (personal digital assistant), an electronic organizer, an electric light bulletin board and a display for advertisement and announcement.

According to the present invention, since the unit area exceeds the pixel region, the degree of freedom is high with regard to the change of the area of the pixel region. As a result, the life span or brightness between the light-emitting elements can be adjusted, the white balance can be easily controlled, and the life span of the overall display device can be lengthened. In addition, even though the required specification such as the necessary brightness and life span is different according to the various purposes, like the substrate size in the television, the initial startup property of the mobile terminal, and the heat-resistant property in a car navigation device and the electro-optical device of the organic EL device, according to the electro-optical device of the present invention, irrespective of the purposes, the design can be freely made according to the required specification while using the same wiring design (array design).

DETAILED DESCRIPTION OF EMBODIMENTS

Hereinafter, structure and manufacturing method of an electro-optical device according to one embodiment of the present invention will be described in detail with reference to the accompanying drawings. In the present embodiment, an organic EL device will be described as one example of an electro-optical device of the present invention.

Figure 1:
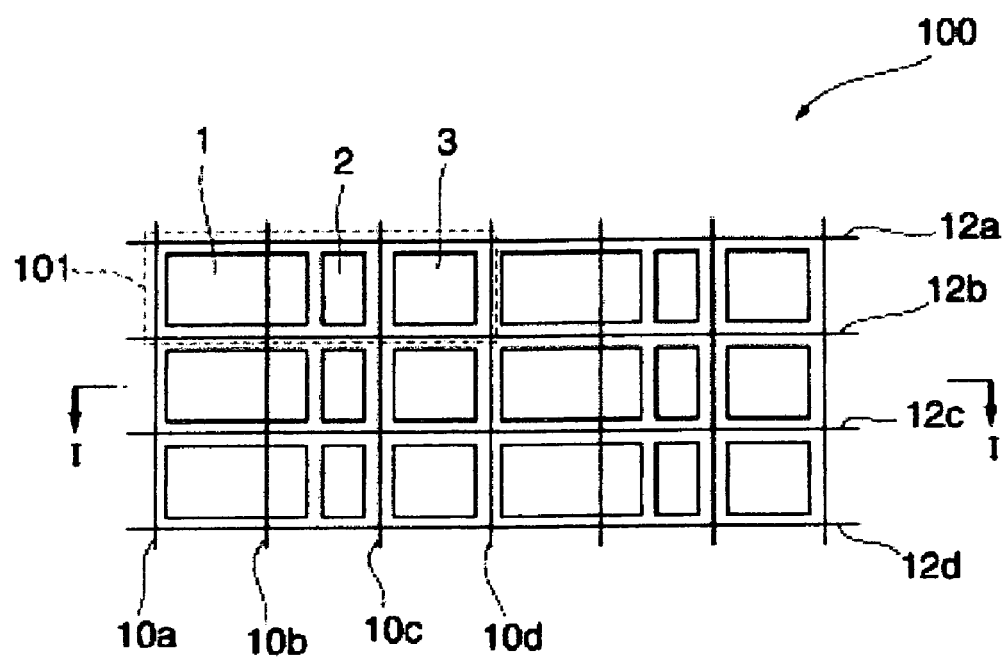
FIG. 1 is a diagram illustrating an organic EL device according to an embodiment of the present invention.

FIG. 1 is a plan view of an organic EL device 100 according to the present embodiment. As shown in FIG. 1, the organic EL device 100 has a configuration in which a plurality of basic pixels 101 each having three pixel regions 1, 2, and 3 are arranged in a matrix.

In the organic EL device 100, a plurality of first wiring lines 10a, 10b, 10c, . . . are arranged along a column direction (vertical direction in the drawing) at an equal interval, a plurality of second wiring lines 12a, 12b, 12c, . . . are arranged along a row direction (horizontal direction in the drawing) at an equal interval, and the first and second wiring lines are orthogonal to each other, respectively.

The first and second wiring lines selectively supply driving signals to the corresponding pixel regions, respectively. In the present embodiment, it is assumed that, for example, one first wiring line and one second wiring line are intended to select a pixel region located at a lower right side of an intersection of the first and second wiring lines, in FIG. 1.

The pixel region 1 is provided such that the pixel region 1 is provided to exceed a unit region surrounded by one first wiring lines (for example, a wiring line 10a) and one second wiring line (for example, a wiring line 12a), which select the corresponding pixel region, and another first wiring line (for example, a wiring line 10b) and another second wiring line (for example, a wiring line 12b) adjacent to the corresponding first and second wiring lines, respectively.

Here, 'the pixel region is provided to exceed the unit region' means that the pixel region exceeds the wiring lines to surround the unit region to extend to another unit region. In the present embodiment, the pixel region may be provided such that the pixel region exceeds any one of four wiring lines to surround the unit region or may be provided such that the pixel region exceeds two or more wiring lines of four wiring lines to surround the unit region. FIG. 1 shows an example in which the pixel region 1 exceeds the wiring line 10b to extend to the unit region surrounded by the wiring lines 10a, 10c, 12a, and 12b.

In addition, according to the present embodiment shown in FIG. 1, in each basic pixel 101, the pixel region 1 is provided such that the pixel region 1 exceeds the unit region. However, the area of the basic pixel 101 is provided not to exceed the total area of the unit regions, that is, three unit regions, of which the total number is the same as the total number of the pixel regions constituting the basic pixel 101.

Figure 2:
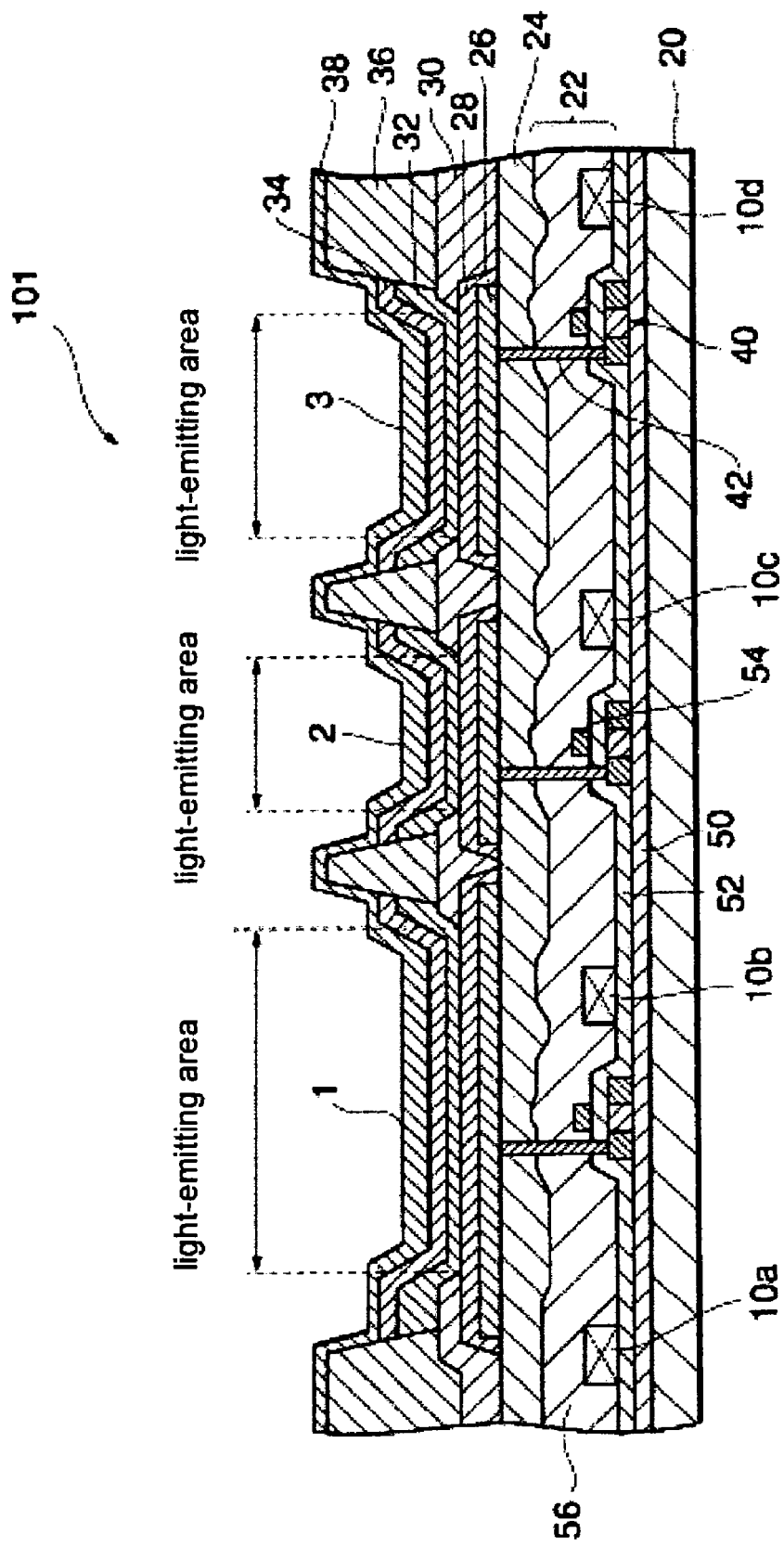
FIG. 2 is a diagram illustrating an organic EL device according to an embodiment of the present invention.

FIG. 2 shows a cross-sectional view of the organic EL device 100 taken along the line I-I' of FIG. 1. The basic pixel 101 comprises a wiring layer 22, a planarizing insulating film 24, a reflecting electrode 26, an electrode 28 made of a transparent material, a hole transporting layer 32, a light-emitting layer 34, and a cathode 38 made of a transparent material, which are sequentially deposited on a substrate 20. In addition, an ITO layer and a sealing film may be provided on the cathode 38.

The wiring layer 22 has thin film transistors (TFTs) 40 and wiring lines 10a, 10b, and 10c which are arranged at an equal interval. The planarizing insulating film 24 is formed on the wiring line layer 22, and the reflecting electrode 26 and the electrodes 28 made of the transparent material are formed on the planarizing insulating film 24 according to the area of the pixel region. The reflecting electrode 26 and the transparent electrode 28 constitute an anode.

The anode, the hole transporting layer 32, the light-emitting layer 34, and the cathode 38 constitute a light-emitting element. By filling a metal such as aluminum in a contact hole 42, the anode is connected to the TFT 40. In the organic EL device having the above-mentioned layer configuration, holes injected from the anode and electrons injected from the cathode 38 travel in the light-emitting layer to be recombined, the electrons of organic molecules forming the light-emitting layer are converted from a base state to an excitation state, and when the electrons return from the unstable excitation state to the base state, energies are emitted. As a result, the organic EL device emits light.

The organic EL device 100 is a top emission type display device that light emitted from the light-emitting layer 34 is radiated to the outside through the transparent cathode 38. Light emitted from the light-emitting layer 34 to the side of the electrode 28 is reflected by the reflecting electrode 26 made of the reflective material such as aluminum and reflected light is radiated to the outside through the cathode 38.

Each of the light-emitting elements is partitioned by a bank 36 made of acryl and the insulating film 30, and the light-emitting region of each light-emitting element corresponds to the region which is not covered with the insulating film 30 as planarly viewing the display device 100.

The pixel region 1 exceeds the wiring line 10b to extend to the region that is interposed between the wiring lines 10b and 10c. The area of the pixel region 1 can be freely larger so long as the reflecting electrode 26 of the light-emitting element included in the pixel region 1 does not cover the contact hole 42 in the adjacent unit region. Specifically, the necessary area of the pixel region can be changed without changing the intervals between the wiring lines 10a, 10b, . . . , and 12a, 12b, . . . . In addition, at the time of changing the area of the pixel region, even though the area of the specific pixel region 2 decreases, the area of the pixel region 1 expands to exceed the wiring line 10b. As a result, the quantity of light of the display device 100 as a whole can increase without increasing the non-emitting region.

The color of the light which the light-emitting element emits can be changed by changing kinds of the organic molecules included in the light-emitting layer 34. For example, the light-emitting layers are formed such that the pixel region 1 emits a blue (B) light component, the pixel region 2 emits a red (R) light component, and the pixel region 3 emits a green (G) light component. As a result, the full color display can be realized through the organic EL device 100.

As described above, the areas of the pixel regions 1, 2, and 3 constituting the basic pixel 101 are determined according to the characteristics of the light-emitting elements included in the respective pixel regions 1, 2 and, 3, that is, light-emitting efficiency. For example, when light-emitting efficiency becomes large in an order of the pixel region 1, the pixel region 3, and the pixel region 2, the pixel regions 1, 2, and 3 have the configuration of the area ratio shown in FIG. 1. Accordingly, even though the current amount of each pixel regions 1, 2, or 3 becomes small in an order of the pixel region 1, the pixel region 3, and the pixel region 2 so that the quantity of light is adjusted, the difference in the current amount for the unit area of the respective pixel regions is not so large. The balance in light emission can be controlled without deteriorating the specific pixel region. As a result, the life span of the overall display device can be lengthened.

In addition, the areas of the respective pixel regions 1, 2, and 3 which constitute the basic pixel 101 may be determined according to the necessary light quantity when the light components emitted from the respective pixel regions 1, 2, and 3 constituting the basic pixel 101 are synthesized to display white light. For example, when the quantity of light required for obtaining the excellent white balance becomes small in an order of the pixel region 1, the pixel region 3, and the pixel region 2, the pixel regions 1, 2, and 3 have the configuration of the area ratio shown in FIG. 1. Accordingly, even though the current amount of the pixel region 1, 2, or 3 becomes small in an order of the pixel region 1, the pixel region 3, and the pixel region 2 so that the quantity of light is adjusted, the difference in the current amount for the unit area of each pixel region is not so large. Therefore, the white balance can be controlled without deteriorating the specific pixel region. As a result, the life span of the overall display device can be lengthened.

In addition, the areas of the respective pixel regions 1, 2, and 3 which constitute the basic pixel 101 may be determined according to the life spans of the light-emitting elements included in the respective pixel regions. Specifically, for example, when the deterioration speed of the light-emitting material of the light-emitting elements which are included in the respective pixel regions becomes low in an order of the pixel region 1, the pixel region 3, and the pixel region 2, the pixel regions 1, 2, and 3 have the configuration of the area ratio shown in FIG. 1. Accordingly, when the current of the same amount flows into the pixel regions 1, 2, and 3, the current amount for the unit area of each of the pixel regions 1, 2 and 3 becomes high in an order of the pixel region 1, the pixel region 3, and the pixel region 2. Therefore, the difference can be smaller in the deterioration speed between the respective pixel regions while suppressing the deterioration speed of the pixel region having the fast deterioration speed. As a result, the life span of the overall display device can be lengthened.

Further, in a case in which light components emitted from the respective pixel regions 1, 2, and 3 constituting the basic pixel 101 are synthesized to display white light, the area of each of the pixel regions 1, 2, and 3 which constitute the basic pixel 101 increases when the pixel region includes a light-emitting element having a large value when the quantity of light required by each light-emitting element is divided by light-emitting efficiency. For example, when the value becomes small in an order of the pixel region 1, the pixel region 3, and the pixel region 2, the pixel regions 1, 2, and 3 have the configuration of the area ratio shown in FIG. 1. Accordingly, even though the current amount of each of the pixel regions 1, 2 and 3 becomes small in an order of the pixel region 1, the pixel region 3, and the pixel region 2, the difference in the current amount for the unit area of each pixel region is not so large. Therefore, the white balance can be controlled without deteriorating the specific pixel region. As a result, the life span of the overall display device can be lengthened.

Next, a method of manufacturing the organic EL device 100 according to the present embodiment will be described.

(Process for Forming the Wiring Layer and Planarizing Insulation Film)

Figure 3:
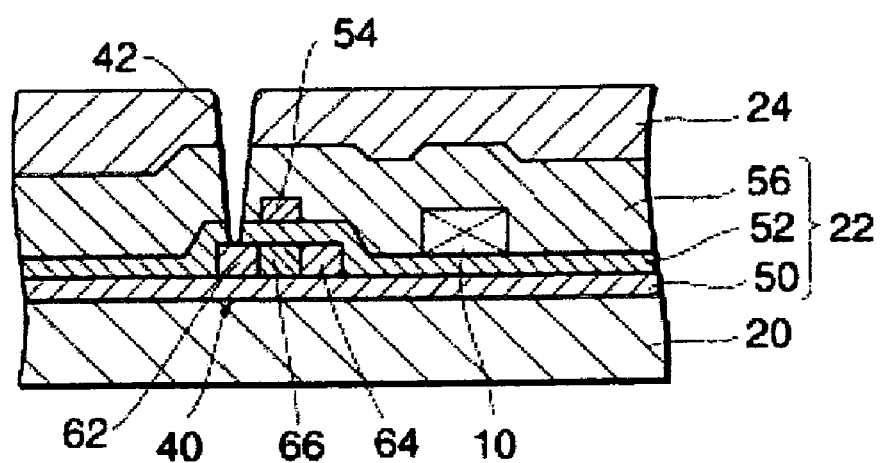
FIG. 3 is a diagram illustrating a manufacturing method of an organic EL device.

As shown in FIG. 3, the wiring layer 22 and the planarizing insulating film 24 are formed on the substrate 20.

First, the insulating film 50 is formed on the substrate 20. As a material for the substrate 20, in addition to transparent resin such as polyester, polyacrylate or polycarbonate, or a transparent material such as glass, since the display device according to the present embodiment is a top emission type display device, a material having no light transmissivity such as stainless can be also used. The insulating film 50 may be, for example, a silicon oxide film and may be formed, for example, at several hundred nanometers by using a plasma chemical vapor deposition (PECVD) method, a low pressure chemical vapor deposition (LPCVD) method, or a sputtering method.

Next, the TFTs 40 are formed on the insulating film 50. The plurality of TFTs 40 are arranged at an equal interval. A crystalline semiconductor film is formed and patterned on the insulating film 50, and an unnecessary part is removed for the formation of the TFT 40. The patterned semiconductor film is shaped. Subsequently, in order to cover the insulating film 50 and the crystalline semiconductor film, the silicon oxide film serving as the insulating film 52 is formed by using an electron cyclotron resonance PECVD (ECR-CVD) method or the PECVD method. The insulating film 52 functions as a gate insulating film of the TFT 40. Next, a metallic thin film such as tantalum and aluminum is formed on the insulating film 52 by using the sputtering method and patterned, thereby obtaining a gate electrode 54. In addition, by implanting impurity ions serving as donor or acceptor using the gate electrode 54 as a mask, source/drain regions 62 and 64 and a channel formation region 66 are formed. And then, XeCl excimer laser is irradiated to the source/drain regions 62 and 64 and the channel formation region 66 with an irradiation energy density of about 400 mJ/cm$^2$ or the source/drain regions 62 and 64 and the channel formation region 66 is subjected to the heat treatment at a temperature of 250 to 450° C., such that the impurity elements are activated.

Subsequently, a wiring line 10 is formed on the insulating film 52. It is preferable that the wiring lines 10a, 10b, . . . be arranged at an equal interval from a design point of view. However, as long as one wiring line is connected to each pixel region, the wiring lines may not be arranged at an equal interval.

Next, an insulating film 56 is formed so as to cover the insulating film 52, the gate electrode 54, and the wiring line 10, so that the wiring layer 22 is completely formed. In addition, the planarizing insulating film 24 made of, for example, organic resin is formed on the insulating film 56 to planarize its surface. In addition, a contact hole 42 that passes through the planarizing insulating film 24 and the insulating film 56 and reaches to the source region 62 of the TFT is formed. By filling the metal such as aluminum in the contact hole 42, the below described reflecting electrode 26 and the source region 62 of the TFT 40 are connected to each other. The metal filled in the contact hole 42 may be piled up by the sputtering method and this process may be performed at the same time as the formation of the reflecting electrode 26.

(Process for Forming the Light-Emitting Element)

Next, the process for manufacturing the light-emitting element provided on the planarizing insulating film 24 will be described with reference to FIGS. 4(a) to 4(e).

Figure 4A:
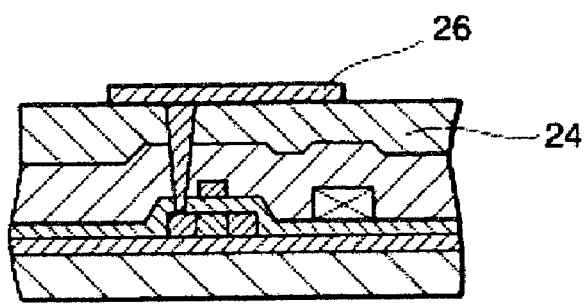
FIG. 4 is a diagram illustrating the manufacturing method of the organic EL device.

As shown in FIG. 4(a), to begin with, the reflecting electrode 26 is formed on the planarizing insulating film 24 to correspond to the area of the pixel region. The reflecting electrode 26 may be made of the metals such as aluminum, gold, silver, magnesium, nickel, zinc, zinc-vanadium, indium, tin or the like. As described above, the reflecting electrode 26 is provided so as to exceed the unit region partitioned by the wiring lines without being limited to the area of the reflecting electrode 26 and without being restricted by the arrangement of the wiring line 10 or TFT 40. However, it is necessary that one contact hole 42 be formed on the region which one reflecting electrode 26 is formed.

Figure 5:
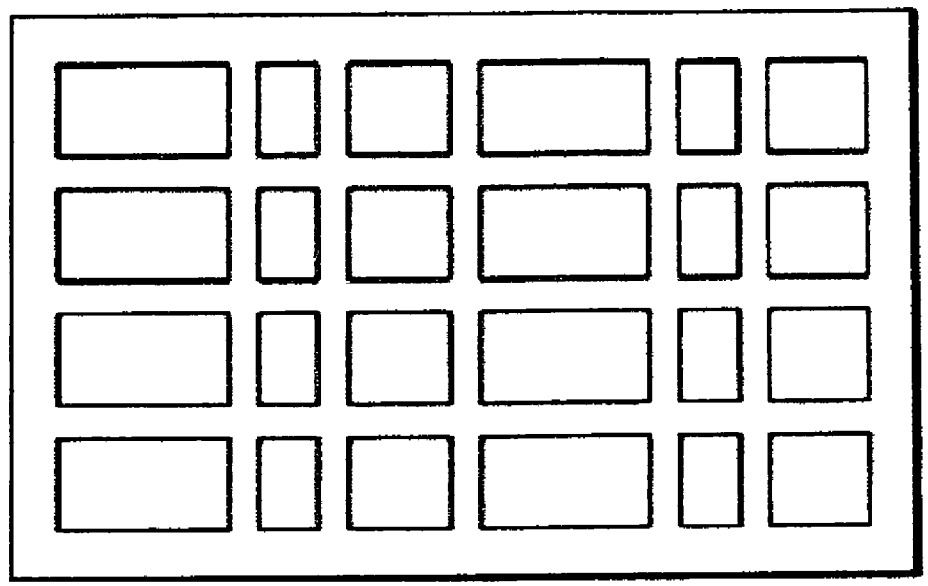
FIG. 5 is a diagram illustrating the manufacturing method of the organic EL device.

The reflecting electrode 26 can be obtained by forming the metal layer on the entire surface of the planarizing insulating film 24 using a sputtering method, an ion plating method or a vacuum deposition method and by patterning the metal layer using an etching process. In the etching process, the resist is first applied on the metal layer and then exposure and development processes are performed using a mask that openings are provided on portions corresponding to the respective pixel regions as shown in FIG. 5. Accordingly, since the resist remains in only the portions that the openings are provided, the etching is performed using that as the etching mask. As a result, the metal layer can be patterned in a predetermined shape.

Figure 4B:
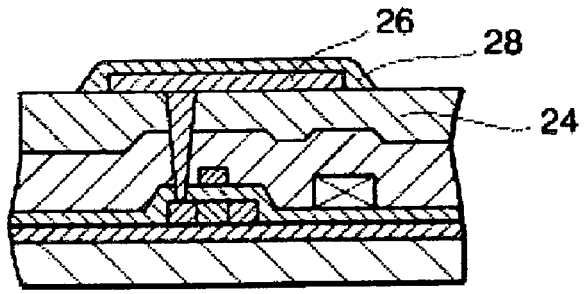

Subsequently, as shown in FIG. 4(b), an electrode 28 made of a transparent material such as ITO (Indium Tin Oxide) is provided so as to cover the reflecting electrode 26. An ITO layer may be formed through the printing by a spin coater or the screen printing, in addition to the sputtering method, the ion plating method and the vacuum deposition method.

Figure 4C:
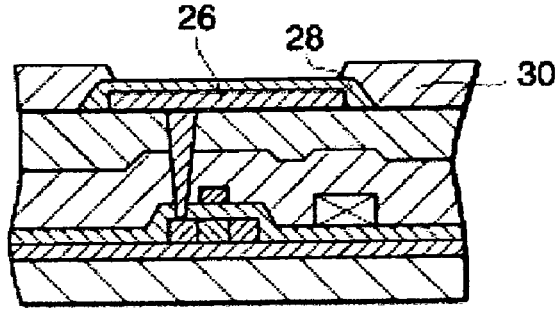

Next, as shown in FIG. 4(c), an insulating film 30 is formed for partitioning the respective light-emitting elements. The insulating film 30 may be, for example, a silicon oxide film, and it may be patterned by a photolithography method and an etching method after the insulating film 30 is piled up on the entire surface of the substrate by the CVD method. The silicon oxide film is first formed on the entire surface of the substrate and is removed by the etching so as to expose the anode. In the light-emitting element according to the present embodiment, the region from which the silicon oxide film is removed functions as the light-emitting region.

Figure 4D:
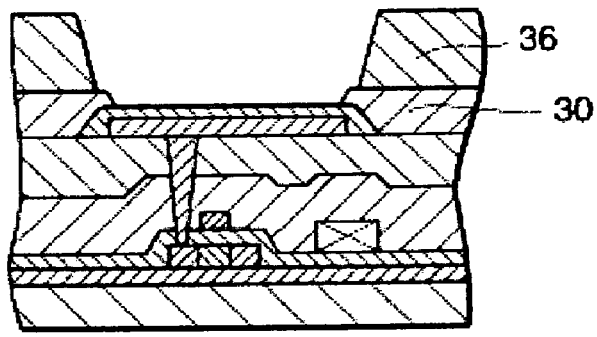

Subsequently, as shown in FIG. 4(d), a bank 36 is formed on the insulating film 30. A layer is formed on the entire surface of the substrate using acryl and the light-emitting region is removed by the etching, thereby obtaining the bank 36.

Figure 4E:
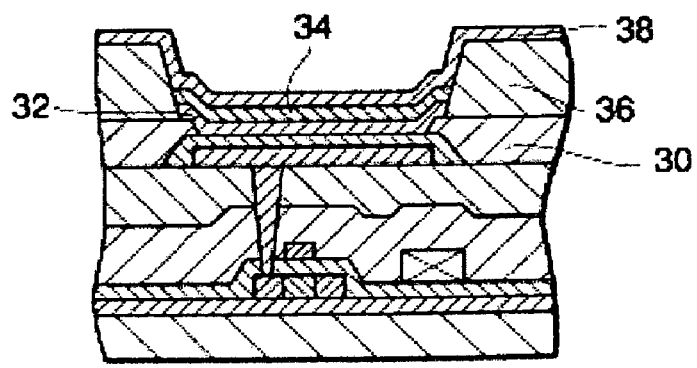

As shown in FIG. 4(e), the hole transporting layer 32, the light-emitting layer 34, and the cathode 38 are deposited on the ITO electrode 28 in the region surrounded by the bank. The hole transporting layer 32 can be formed by the co-deposition of, for example, a carbazole polymer and a TPD: triphenyl compound. In addition, the hole transporting layer 32 can be formed by ejecting composition ink containing a hole transporting layer material on the ITO electrode through an inkjet method and by performing the drying treatment and the heat treatment on the ejected composition ink. As the composition ink, a solution in which a mixture of a polythiophene derivative and polystyrenesulfonic acid is dissolved in a polar solvent such as water can be used.

The light-emitting layer 34 can be formed by ejecting the composition ink containing the light-emitting layer material on the hole transporting layer 32 through the inkjet method and by performing the drying treatment and the heat treatment on the ejected composition ink. The material for forming the light-emitting layer 34 may be a fluorene-based derivative, a polyphenylene derivative, polyvinylcarbazole, a polythiophene derivative or materials obtained by doping into these polymer materials, a perylene-based pigment, a coumarin-based pigment, and a rhodamine-based pigment, for example, rubrene, perylene, 9,10-diphenylanthracene, tetraphenylbutadiene, Nile red, coumarin 6, quinacridone or the like. BY using these materials, different color light components can be emitted. According to the method for determining the light-emitting area of each color component, the light-emitting material for emitting the color light component determined so as to have the large light-emitting area as compared to other color components is ejected on the anode and the hole transporting layer which are formed so as to have the area larger than those of other pixel regions. When the light-emitting layer material of any one color component is ejected, it is preferable to use the mask manufactured so as to cover the pixel regions corresponding to other color components.

The cathode 38 is provided so as to cover the light-emitting layer 34 and the bank 36. For example, the cathode 38 can be formed by the sputtering method using the transparent material such as ITO or indium-zinc oxide (IZO). Further, a sealing film made of a transparent material may be formed on the cathode 38.

Through the above-mentioned processes, the organic EL device having the different area can be obtained by each pixel region. According to the method, since it is constant up to the process for forming the contact hole 42 irrespective of the area of the display region, the change of the design is not required up to the process for forming the contact hole even when the display device having the different areas of the pixel regions is manufactured.

By making the light-emitting areas for the color components different from each other, the current amount for the unit area flowing into the light-emitting element that emits the selected color light component can be reduced. Therefore, in a state in which the light-emitting element having low light-emitting efficiency and the light-emitting element which needs the quantity of light larger than those of other light-emitting elements in order to control the white balance have the large light-emitting areas, even though the current larger than those in other light-emitting elements flows into the corresponding light-emitting element, the corresponding light-emitting element can be prevented from fast deteriorating as compared to other light-emitting elements. In addition, by designing the light-emitting element having the light-emitting material which has an originally fast deterioration speed so as to have the light-emitting area larger than those of other light-emitting elements, the difference in the deterioration speed can be smaller as compared to other light-emitting elements. In such a manner, by preventing the life span of the specific light-emitting element from being shorten, the life span of the overall display device can be lengthened.

FIGS. 6A to 6D, and 7A and 7B are diagrams showing examples of electronic apparatuses to which the above-mentioned organic EL device 100 can be applied. FIG. 6(*a*) shows a cellular phone to which the organic EL device is applied. The cellular phone 230 has an antenna unit 231, a voice output unit 232, a voice input unit 233, an operating unit 234, and the organic EL device 100 of the present invention. As such, the organic EL device according to the present invention can be applied as a display unit. FIG. 6(*b*) a video camera to which the organic EL device is applied. The video camera 240 comprises a receiving unit 241, an operating unit 242, a voice input unit 243, and the organic EL device 100 of the present invention.

Figure 6A:
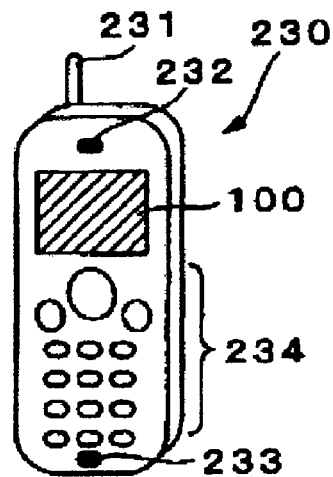
FIG. 6 is a diagram showing examples of electronic apparatuses to which an electro-optical device can be applied.
Figure 6B:
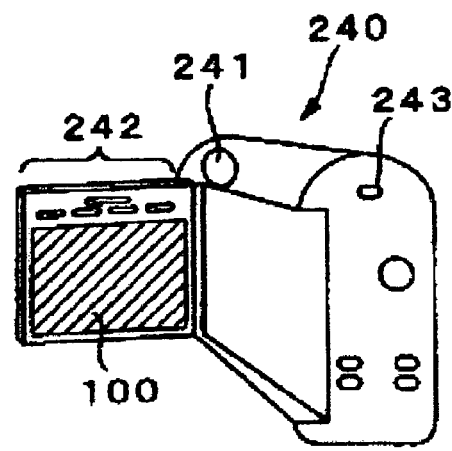
Figure 6C:
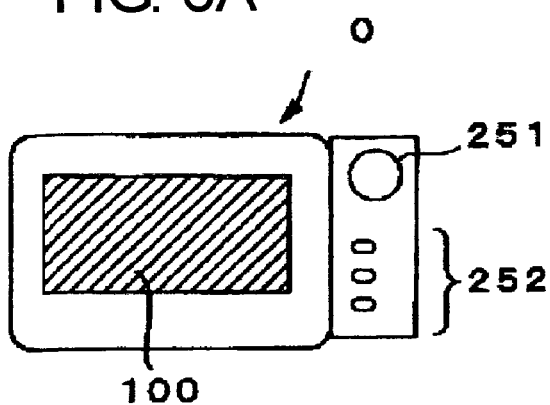
Figure 6D:
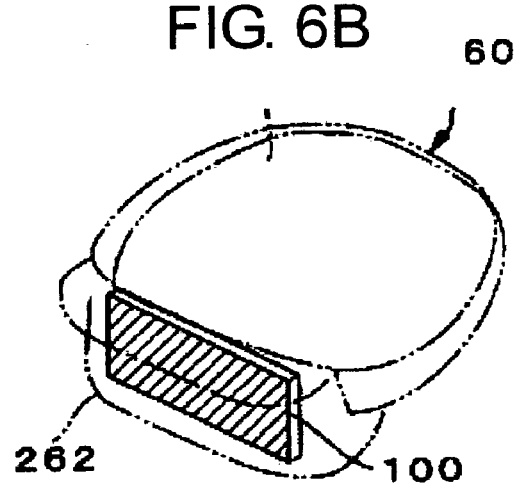

FIG. 6C shows a portable personal computer (for example, PDA) to which the organic EL device is applied. The portable personal computer 250 has a camera unit 251, an operating unit 252, and the organic EL device 100 according to the present invention. FIG. 6(*d*) shows a head-mounted display to which the organic EL device is applied. The head-mounted display 260 has a band 261, an optical system housing unit 262, and the organic EL device 100 according to the present invention.

Figure 7A:
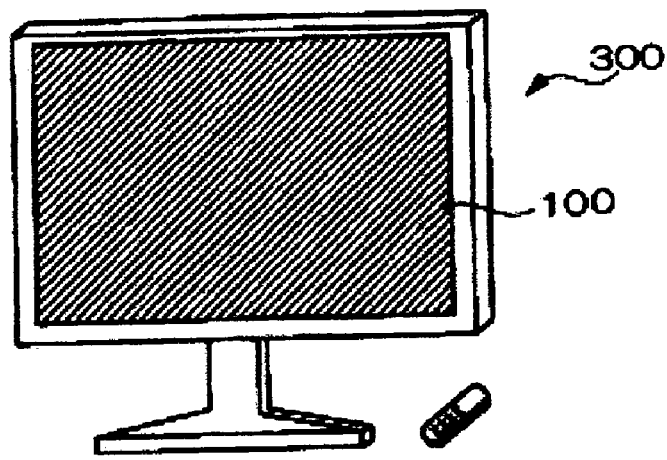
FIG. 7 is a diagram showing examples of electronic apparatuses to which an electro-optical device can be applied.
Figure 7B:
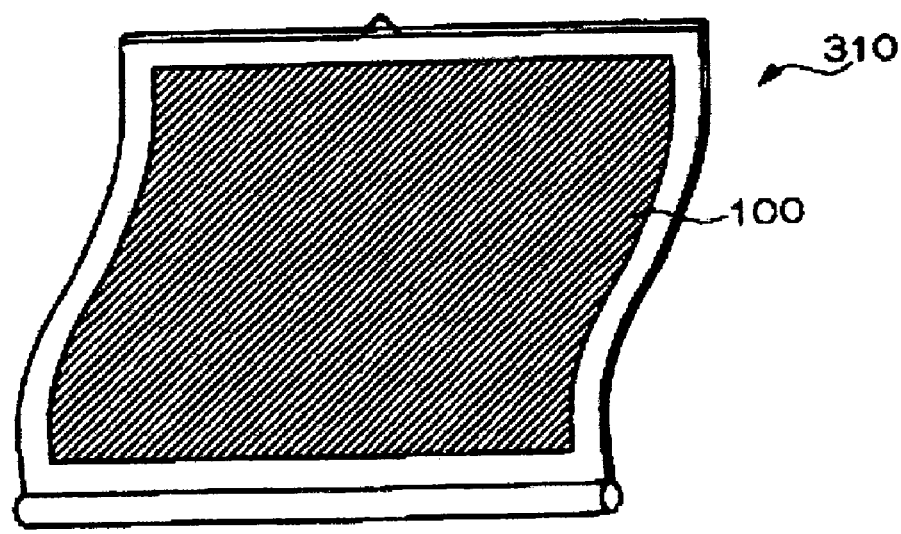

FIG. 7A shows a television to which the organic EL device is applied. The television 300 has an organic EL device 100 according to the present invention. Similarly, the organic EL device according to the present invention can be applied to a monitor device used for a personal computer or the like. FIG. 7(*b*) shows a roll-up type television to which the organic EL device is applied. The roll-up type television 310 has the organic EL device 100 according to the present invention.

In addition, the organic EL device according to the present invention is not limited to the above-mentioned examples, but it can be applied to various electronic apparatuses having the display function. For example, the organic EL device according to the present invention can be applied to a facsimile device having the display function, a finder of a digital camera, a portable television, an electronic organizer, an electric light bulletin board a display for advertisement and announcement, in addition to the above-mentioned electronic apparatuses.

For example, the electro-optical device of the organic EL device demands different specification such as necessary brightness or the life span according to various purposes, like the size of the substrate in the television, an initial startup property of the mobile terminal such as the PDA, the heat-resistant property in a car navigation device or the like. In this case, according to the electro-optical device of the present invention, irrespective of the purposes, the design can be freely made according to the required specification while using the same wiring line design (array design).

In addition, the present invention is not limited to the above-mentioned embodiment and various modifications can be made without departing from the spirit of the present invention. For example, in the above-mentioned manufacturing method of the organic EL device, the areas of the pixel regions are made to be different from each other by making the areas of the anodes different from each other. However, by forming the anode with the same size and adjusting the removing area when etching the insulating film 30 formed on the anode, the light-emitting area of each pixel region can be changed. In addition, when the bank 36 is formed and patterned, the area of each pixel region can be changed.

In addition, in the above-mentioned manufacturing method of the organic EL device, the contact holes 42 are formed at the equal interval and each reflecting electrode 26 is formed so as not to overlap the contact hole 42 of the adjacent unit region. However, when the pixel region increases, the interval of the contact holes 42 may be changed. In this case, the area of the pixel region is changed, the design of the location, at which the contact hole 42 is formed, is needed to be changed. However, the change of the design is not required up to the process of forming the planarizing insulating film 24.

What is claimed is:

1. An electro-optical device comprising:
   first wiring lines;
   second wiring lines substantially orthogonal to the first wiring lines;
   a plurality of pixel regions including a first pixel region and a second pixel region, one of the pixel regions selected by one of the first wiring lines and one of the second wiring lines;
   light-emitting elements included in the pixel regions, which are provided on a substrate;
   a first electrode;
   second electrodes made of a transparent material;
   a light-emitting layer interposed between the first electrode and one of the second electrodes,
   light emitted from the light-emitting layer being radiated in a direction opposite to the substrate via the one of the second electrodes;
   unit regions respectively surrounded by two of the first wiring lines that are adjacent to each other and two of the second wiring lines that are adjacent to each other, the unit regions including a first unit region, a second unit region and a third unit region, the first unit region being adjacent to the second unit region; and
   an intervening wiring line intervening between the first unit region and the second unit region, the intervening wiring line being either one of the first wiring lines or one of the second wiring lines that defines the first unit region, wherein the first pixel region is provided in both the first unit region and the second unit region so as to cross the intervening wiring, and wherein the second pixel region is provided only within the second unit region.

2. An electronic apparatus comprising an electro-optical device as claimed in claim 1.

3. An electro-optical device comprising:

first wiring lines;

second wiring lines substantially orthogonal to the first wiring lines;

a plurality of pixel regions including a first pixel region and a second pixel region, one of the pixel regions selected by one of the first wiring lines and one of the second wiring lines;

light-emitting elements included in the pixel regions, which are provided on a substrate;

a first electrode;

second electrodes made of a transparent material;

a light-emitting layer interposed between the first electrode and one of the second electrodes, light emitted from the light-emitting layer being radiated in a direction opposite to the substrate via the one of the second electrodes;

unit regions respectively surrounded by two of the first wiring lines that are adjacent to each other and two of the second wiring lines that are adjacent to each other, the unit regions including a first unit region, a second unit region and a third unit region, the first unit region being adjacent to the second unit region; and an intervening wiring line intervening between the first unit region and the second unit region, the intervening wiring line being either one of the first wiring lines or one of the second wiring lines that defines the first unit region, wherein basic pixels are constructed by the plurality of pixel regions that includes the first pixel region and the second pixel region, and the first region of each basic pixel being provided in both the first unit region and the second unit region so as to cross the intervening wiring line, and wherein the second pixel region of each basic pixel is provided only within the second unit region.

4. The electro-optical device according to claim 3, wherein the total area of each basic pixel does not exceed the total area of the unit regions which have the same total number of pixel regions as that of the basic pixel.

5. The electro-optical device according to claim 3, wherein the first and/or second wiring lines are arranged at substantially equal intervals, and in each basic pixel, the area of each pixel region is set according to the characteristics of the light-emitting element.

6. The electro-optical device according to claim 3, wherein in each basic pixel, the area of the pixel region increases when the pixel region includes a light-emitting element having low light-emitting efficiency.

7. The electro-optical device according to claim 3, wherein in each basic pixel, the area of the pixel region increases when the pixel region includes a light-emitting element having a short life span.

8. The electro-optical device according to claim 3, wherein when light components emitted from the respective pixel regions constituting each basic pixel are synthesized to display white light, the area of the pixel region increases when the pixel region includes a light-emitting element emitting a color light component which needs a large quantity of light.

9. The electro-optical device according to claim 3, wherein when light components emitted from the respective pixel regions constituting each basic pixel are synthesized to display white light, the area of the pixel region increases when the pixel region includes a light-emitting element having a high ratio of necessary quantity of light to light-emitting efficiency.

* * * * *